US006726534B1

(12) United States Patent
Bogush et al.

(10) Patent No.: US 6,726,534 B1
(45) Date of Patent: Apr. 27, 2004

(54) PREEQUILIBRIUM POLISHING METHOD AND SYSTEM

(75) Inventors: Gregory H. Bogush, Aurora, IL (US); Jeffrey P. Chamberlain, Aurora, IL (US); Paul M. Feeney, Aurora, IL (US); Brian L. Mueller, Middleton, DE (US); David J. Schroeder, Aurora, IL (US); Alicia F. Walters, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 89 days.

(21) Appl. No.: 10/085,698

(22) Filed: Feb. 28, 2002

Related U.S. Application Data

(60) Provisional application No. 60/272,692, filed on Mar. 1, 2001.

(51) Int. Cl.[7] .............................. B24B 1/00; B24B 41/00
(52) U.S. Cl. .............................. 451/36; 451/41; 451/59; 451/63; 451/550; 51/308; 51/309
(58) Field of Search ..................... 51/308, 309; 216/88, 216/89; 438/692, 693; 451/36, 41, 59, 63, 550

(56) References Cited

U.S. PATENT DOCUMENTS

| 3,162,986 A | 12/1964 | Olivieri |
| 3,500,591 A | 3/1970 | Gawronski et al. |
| 3,979,239 A | 9/1976 | Walsh |
| 4,244,775 A | 1/1981 | D'Asaro |
| 4,439,042 A | 3/1984 | Bertoglio |
| 4,954,142 A | 9/1990 | Carr et al. |
| 5,300,155 A | 4/1994 | Sandhu et al. |
| 5,352,277 A | 10/1994 | Sasaki |
| 5,376,222 A | 12/1994 | Miyajima et al. |
| 5,395,801 A | 3/1995 | Doan et al. |
| 5,407,526 A | 4/1995 | Danielson et al. |
| 5,486,129 A | 1/1996 | Sandhu et al. |
| 5,540,810 A | 7/1996 | Sandhu et al. |
| 5,769,689 A | 6/1998 | Cossaboon et al. |
| 5,846,398 A | 12/1998 | Carpio |
| 5,876,508 A | 3/1999 | Wu et al. |
| 5,922,620 A | 7/1999 | Shimomura et al. |
| 5,928,962 A | 7/1999 | Farkas et al. |
| 5,938,505 A | 8/1999 | Morrison et al. |
| 5,958,794 A | 9/1999 | Bruxvoort et al. |
| 5,994,224 A | 11/1999 | Sandhu et al. |
| 6,000,996 A | 12/1999 | Fujiwara |
| 6,001,269 A | 12/1999 | Sethuraman et al. |
| 6,019,806 A * | 2/2000 | Sees et al. ................ 51/308 |
| 6,027,669 A | 2/2000 | Miura et al. |
| 6,028,006 A | 2/2000 | Bawa et al. |
| 6,040,245 A | 3/2000 | Sandhu et al. |
| 6,046,111 A | 4/2000 | Robinson |
| 6,071,816 A | 6/2000 | Watts et al. |
| 6,322,600 B1 * | 11/2001 | Brewer et al. ............. 51/308 |
| 6,336,945 B1 * | 1/2002 | Yamamoto et al. ......... 51/309 |
| 6,361,403 B1 * | 3/2002 | Kuramochi et al. ........ 451/41 |
| 6,454,820 B2 * | 9/2002 | Hagihara et al. .......... 51/308 |
| 6,500,055 B1 * | 12/2002 | Adams et al. ............ 451/270 |
| 6,524,167 B1 * | 2/2003 | Tsai et al. ................ 451/41 |

OTHER PUBLICATIONS

US 5,985,755, 11/1999, Bajaj et al. (withdrawn)

* cited by examiner

Primary Examiner—Timothy V. Eley

(57) ABSTRACT

The invention provides a polishing system that comprises a liquid carrier, an alkali metal ion, hydroxide ions, and a polishing pad and/or an abrasive. The abrasive can be dispersed in the liquid carrier of the polishing system or bound to the polishing pad. The alkali metal ion can be any univalent group I metal ion and is present in the polishing system at a concentration of about 0.05 M or more. Hydroxide ions are present in a sufficient amount to provide the system with a pH of about 9 or more. The liquid carrier of the polishing system can be any suitable polar solvent, such as water. The invention further provides a polishing method that involves polishing a portion of a substrate with the polishing system beginning about 6 hours or less after the polishing system is prepared.

45 Claims, No Drawings

PREEQUILIBRIUM POLISHING METHOD AND SYSTEM

This application claims the benefit of Provisional Application No. 60/272,692, filed Mar. 1, 2001.

TECHNICAL FIELD OF THE INVENTION

The present invention provides chemical mechanical polishing systems and methods for their use in polishing.

BACKGROUND OF THE INVENTION

In the course of manufacturing integrated circuits, it is generally necessary to polish or planarize the surfaces of semiconductor wafers. Such mechanical treatment may be done to remove high topography, surface defects, scratches, roughness, or embedded particles. A chemical slurry can be used to carry out this process. Polishing with a slurry is called chemical-mechanical planarization (CMP).

In a typical CMP process, a wafer is pressed against a polishing pad in the presence of a slurry under controlled chemical, pressure, velocity, and temperature conditions. The slurry generally contains small, abrasive particles that abrade the surface of the wafer in a mixture with chemicals that etch and/or oxidize the newly formed surface of the wafer. The polishing pad is generally a planar pad made from a continuous phase matrix material such as polyurethane. Thus, when the pad and/or the wafer move with respect to each other, material is removed from the surface of the wafer mechanically by the abrasive particles and chemically by the etchants and/or oxidants in the slurry.

CMP slurries are typically prepared and stored for extended periods before use in polishing a substrate. Under these conditions the chemical components typically reach a chemical equilibrium with the abrasive. However, polishing substrate surfaces with equilibrium CMP mixtures is not always the optimal method, especially when the chemical components are reactive with both the wafer surface and the abrasive particles and reaction with the substrate surface provides advantageous polishing characteristics. This is because the reaction of the chemical component with the abrasive particle surface prior to polishing lowers the concentration of that component available for reaction with the substrate surface during polishing. Consequently, the polishing performance of certain equilibrium CMP slurries is not optimal for the polishing of solid surfaces, including integrated circuit wafer surfaces, memory or rigid disk surfaces, glass surfaces, magnetic media, etc. Furthermore, because CMP slurries must be stable for the extended periods over which they are typically stored before use, the chemical additives available for use in slurries is limited by their reactivity with slurry components, particularly the abrasive. This consideration also limits the concentration of certain additives that can be incorporated into slurries.

Thus, methods are needed to improve CMP slurry performance that can increase the potential advantages achievable by the reaction of chemical components with substrate surfaces and which minimize the disadvantages arising from the reactivity of those components within CMP slurries. The present invention provides such a method. These and other advantages of the present invention, as well as additional inventive features, will be apparent from the description of the invention provided herein.

BRIEF SUMMARY OF THE INVENTION

The invention provides a polishing system that comprises a liquid carrier, an alkali metal ion, hydroxide ions, and a polishing pad and/or an abrasive. When an abrasive is used, it can be dispersed in the liquid carrier of the polishing system or bound to the polishing pad. The alkali metal ion can be any univalent group I metal ion and is present in the polishing system at a concentration of about 0.05 molar (M) or more. Hydroxide ions are present in a sufficient amount to provide the system with a pH of about 9 or more. The liquid carrier of the polishing system can be any suitable polar solvent, such as water. The invention further provides a polishing method that involves polishing a portion of a substrate with the polishing system beginning about 6 hours or less after the polishing system is prepared.

DETAILED DESCRIPTION OF THE INVENTION

The invention provides a polishing system and method for polishing a substrate. The polishing system comprises, consists essentially of, or consists of (a) a liquid carrier, (b) an alkali metal ion at a concentration of about 0.05 M or more, (c) hydroxide ions sufficient to provide the polishing system with a pH of about 9 or more, and (d) a polishing pad and/or an abrasive. The polishing method involves contacting a surface of a substrate with such a polishing system, particularly a polishing system comprising (a) a liquid carrier, (b) an alkali metal ion at a concentration of about 0.05 M or more, (c) hydroxide ions sufficient to provide the polishing system with a pH of about 9 or more, and (d) a polishing pad and/or an abrasive, and polishing at least a portion of the substrate before the polishing system components reach a chemical equilibrium after the system is prepared.

Typically, the polishing system is used about 6 hours or less after the polishing system is prepared, which generally will be before the polishing system reaches chemical equilibrium. Preferably, the polishing system is used about 4 hours or less (e.g., about 2 hours or less, about 1 hour or less, about 30 minutes or less, about 10 minutes or less, about 5 minutes or less, or even about 1 minute or less) after the polishing system is prepared. Indeed, the polishing system can be used seconds (e.g., about 30 seconds or less, or about 10 seconds or less) after the polishing system is prepared, such as when the polishing system components are mixed very near or at the point-of-use of the polishing system (e.g., on the polishing pad and/or substrate being polished).

The term"component" as used herein includes individual ingredients (e.g., acids, bases, oxidizers, water, etc.) as well as any combination of ingredients (e.g., aqueous compositions, abrasive slurries, mixtures and solutions of oxidizers, acids, bases, complexing agents, etc.) that are stored separately and combined to form a polishing system.

The invention can be used to polish any suitable substrate. Suitable substrates are typically wafers used in the semiconductor industry that are in need of polishing or planarizing. They comprise, for example, a metal, metal oxide, metal composite, metal alloy, or mixtures thereof. The substrate can comprise metals such as copper, aluminum, titanium, tungsten, gold, and combinations (e.g., alloys or mixtures) thereof. The substrate also can comprise metal oxides such as alumina, silica, titania, ceria, zirconia, germania, magnesia, and co-formed products thereof, and mixtures thereof. In addition, the substrate can comprise metal composites and/or alloys such as metal nitrides (e.g., silicon nitride, tantalum nitride, titanium nitride, and tungsten nitride), metal carbides (e.g., silicon carbide and tungsten carbide), nickel-phosphorus, alumino-borosilicate, borosilicate glass, phosphosilicate glass (PSG), borophosphosilicate glass (BPSG), silicon-germanium alloys, and silicongermanium-carbon alloys. The substrate also can comprise semiconductor base materials such as single-crystal silicon, polycrystalline silicon, amorphous silicon, silicon-on-insulator, and gallium arsenide. The substrate also can comprise a low dielectric resin, such as a nanoporous siloxane resin formed from an alkylhydridosiloxane, a doped silicon oxide, such as boron, carbon, or halogen-doped silicon oxide, or such other low dielectric resins as are known, such as BLACK DIAMOND, manufactured by Applied Materials, CORAL, manufactured by Novellus Systems, Inc., and SILK, manufactured by Dow. Substrate materials can be porous or nonporous, as desired. The invention is not limited to semiconductor polishing. It can also be applied to glass substrates, including technical glass, optical glass, and ceramics, of various types known in the art.

The invention can be used to polish any part of a substrate (e.g., a semiconductor device) at any stage in the production of the substrate. For example, a particularly effective use of certain polishing systems of the invention is in polishing a semiconductor device in conjunction with shallow trench isolation (STI) processing or in conjunction with the formation of an interlayer dielectric (ILD), as is known in art.

Any suitable abrasive can be used in conjunction with the present inventive polishing system. Suitable abrasives are capable of polishing a substrate surface without introducing deleterious scratches or other imperfections in the substrate surface. The abrasive preferably is a metal oxide. Suitable metal oxide abrasives include, for example, alumina, silica, titania, ceria, zirconia, and magnesia, as well as co-formed products thereof, mixtures thereof, and chemical admixtures thereof Silica is the preferred abrasive, with fumed silica being more preferred.

The abrasive can have any suitable abrasive particle characteristics depending on the desired polishing effects. In particular, the abrasive can have any suitable surface area. A suitable abrasive surface area, for example, is a surface area ranging from about 5 $m^2/g$ to about 430 $m^2/g$ (e.g., about 5–200 $m^2/g$), as calculated from the method of S. Brunauer, P. H. Emmet, and I. Teller, J. Am. Chem. Soc., 60, 309 (1938). Desirably, the abrasive used in conjunction with the present invention is about 90 $m^2/g$ or more.

The abrasive can be combined with (e.g., suspended in) any suitable liquid carrier to form a dispersion or suspension (i.e., a "slurry"). Suitable liquids generally include polar solvents, preferably water or an aqueous solvent. Where the abrasive is included in a dispersion, the dispersion can have any concentration of abrasive that is suitable for polishing. Generally, the polishing system will contain about 0.1–40 wt. % abrasive suspended in the liquid carrier. Desirably, the polishing system contains about 1–20 wt. % abrasive (e.g., about 2–15 wt. % abrasive) suspended in the liquid carrier. More desirably, the polishing system contains about 5–10 wt. % abrasive suspended in the liquid carrier. Certain polishing systems contain about 4–6 wt. % abrasive, whereas other polishing systems contain about 8–12 wt. % abrasive, suspended in the liquid carrier.

Alternatively, the abrasive in the polishing system can be fixed (e.g., embedded) in or on a polishing pad. The aforementioned considerations as to the type of abrasive particle suitable for dispersions are applicable to embedded abrasives. Any suitable amount of abrasive can be embedded in the pad. A suitable amount is any amount sufficient to provide for polishing of a substrate surface at a suitable rate without introducing deleterious scratches or other imperfections in the substrate surface.

The inventive polishing system contains alkali metal ions. Any alkali metal ion is suitable in the present polishing system. This includes ions of any of the univalent basic metals of group I of the periodic table. For example, sodium, potassium, rubidium, and cesium ions can be used, wherein sodium, potassium, and cesium ions are preferred, with potassium being more preferred. Any suitable source of alkali metal ions can be used. For example, alkali metal salts or alkali metal hydroxides (e.g. KCl or KOH) are suitable sources of alkali metal ions.

Any suitable concentration of alkali metal ion can be used in the polishing system. Suitable concentrations provide for increased polishing rates in the polishing system of the invention. Thus, concentrations of alkali metal ions generally are about 0.05 molar (M) or more. Higher concentrations also are suitable. For example, concentrations of at least about 0.1, 0.2, 0.4, 0.6, or 1 M can be used in the present polishing system.

The polishing system has hydroxide ions sufficient to provide a pH of about 9 or more. More preferably, the pH of the polishing system is about 10 or more, or even at least about 11, 12, or 13, and can even be as high as 14 and higher, so long as a suitable polishing rate is maintained. The hydroxide ion concentration can be adjusted using any suitable pH adjuster as described hereinafter. Because the inventive methods disclosed herein provide for use of the polishing system beginning at about 6 hours after mixing or less and preferably at the point-of-use, a higher pH can be used than would otherwise be possible for polishing systems that are allowed to reach chemical equilibrium, which systems must be stable upon storage for extended periods, such as for days, weeks, or months before use.

At its simplest, the present inventive polishing system consists essentially of a liquid carrier, an alkali metal ion, sufficient hydroxide ions to provide the desired pH of 9 or more, and a polishing pad and/or abrasive. In certain polishing systems of the invention, the alkali metal ion concentration is about 0.4 M or more. As mentioned, the liquid carrier is preferably a polar solvent, particularly water.

In certain embodiments, a variety of other additives are contemplated and can be used. For example, film-forming agents, complexing agents, surfactants, rheological control agents, polymeric stabilizers or surface active dispersing agents, and/or halide ions can be used as described hereinafter.

Any suitable film-forming agent (i.e., corrosion-inhibitor) can be used in conjunction with the present polishing system. For example, in STI polishing methods, suitable film-forming agents generally include surface-active agents (i.e. surfactants) that preferentially adsorb to and prevent polishing of silicon nitride. Therefore, suitable film-forming agents include for example, alkylamines, alkanolamines, hydroxylamines, phosphate esters, sodium laurylsulfate, fatty acids, polyacrylates, polymethacrylates, polyvinylphosphonates, polymalate, polystyrenesulfonate, and polyvinylsulfonate. Other suitable film-forming agents include, for example, benzotriazole, triazole, benzimidazole, and mixtures thereof.

Any suitable complexing agent (i.e., chelating agent or selectivity enhancer) can be used in conjunction with the present inventive polishing system. Suitable complexing agents include, for example, carbonyl compounds (e.g., acetylacetonates and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, phthalates, citrates, succinates, tartrates, malates, edetates (e.g., disodium EDTA), mixtures thereof, and the like), and carboxylates containing one or more sulfonic and/or phosphonic groups. Suitable chelating or complexing agents also can include, for example, di-, tri-, or poly-alcohols (e.g., ethylene glycol, pyrocatechol, pyrogallol, tannic acid, and the like) and phosphate-containing compounds, e.g., phosphonium salts, and phosphonic acids. Complexing agents also can include amine-containing compounds (e.g., amino acids, amino alcohols, di-, tri-, and poly-amines, and the like). Examples of amine-containing compounds include methylamine, dimethylamine, trimethylamine, ethylamine, diethylamine, triethylamine, ethanolamine, diethanolamine, diethanolamine cocate, triethanolamine, isopropanolamine, diisopropanolamine, triisopropanolamine, nitrosodiethanolamine, and mixtures thereof. Suitable amine-containing compounds further include ammonium salts (e.g., tetramethylamine and quaternary ammonium compounds). The amine-containing compound also can be any suitable cationic amine-containing compound, such as, for example, hydrogenated amines and quaternary ammonium compounds, that adsorbs to the silicon nitride layer present on the substrate being polished and reduces, substantially reduces, or even inhibits (i.e., blocks) the removal of silicon nitride during polishing.

Any suitable surfactant and/or rheological control agent can be used in conjunction with the present polishing system, including viscosity enhancing agents and coagulants. Suitable rheological control agents include, for example, polymeric rheological control agents. Moreover, suitable rheological control agents include, for example, urethane polymers (e.g., urethane polymers with a molecular weight greater than about 100,000 Daltons), acrylates comprising one or more acrylic subunits (e.g., vinyl acrylates and styrene acrylates), and polymers, copolymers, and oligomers thereof, and salts thereof. Suitable surfactants include, for example, cationic surfactants, anionic surfactants, anionic polyelectrolytes, nonionic surfactants, amphoteric surfactants, fluorinated surfactants, mixtures thereof, and the like.

The polishing system of the invention can contain any suitable polymeric stabilizer or other surface active dispersing agent. Suitable stabilizers include, for example, phosphoric acid, organic acids, tin oxides, organic phosphonates, mixtures thereof, and the like.

It will be appreciated that the compounds recited herein have been classified for illustrative purposes; there is no intent to limit the uses of these compounds. As those of skill in the art will recognize, certain compounds may perform more than one function. For example, some compounds can function both as a chelating agent and an oxidizing agent (e.g., certain ferric nitrates and the like).

Any of the components used in conjunction with the invention can be provided in the form of a mixture or solution in an appropriate carrier liquid or solvent (e.g., water or an appropriate organic solvent). Furthermore the compounds, alone or in any combination, can be used as components of the polishing system. Two or more components then desirably are individually stored and subsequently mixed to form the polishing system. In this regard, it is suitable for the polishing system to be prepared (e.g., for all the components to be mixed together) no more than 6 hours prior to delivery to the polishing pad or to the surface of the substrate. It is also suitable for the polishing system to be prepared on the surface of the polishing pad or on the surface of the substrate, through delivery of the components of the polishing system from two or more distinct sources, whereby the components of the polishing system meet at the surface of the polishing pad or at the surface of the substrate (e.g., at the point-of-use). In either case, the flow rate at which the components of the polishing system are delivered to the polishing pad or to the surface of the substrate (i.e., the delivered amount of the particular components of the polishing system) can be altered prior to the polishing process and/or during the polishing process, such that the polishing characteristics, such as rate, selectivity, and/or viscosity of the polishing system is altered.

When two or more of the components are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) or an in-line mixer through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

A component can have any pH appropriate in view of the storage and contemplated end-use, as will be appreciated by those of skill in the art. Moreover, the pH of a component used in conjunction with the present invention can be adjusted in any suitable manner, e.g., by adding a pH adjuster, regulator, or buffer. Suitable pH adjusters, regulators, or buffers include acids, such as, for example, inorganic acids (e.g., nitric acid, hydrochloric acid, sulfuric acid, phosphoric acid) and organic acids (e.g., acetic acid, citric acid, malonic acid, succinic acid, tartaric acid, and oxalic acid). Suitable pH adjusters, regulators, or buffers also include bases, such as, for example, inorganic hydroxide bases (e.g., sodium hydroxide, potassium hydroxide, ammonium hydroxide, and the like) and carbonate bases (e.g., sodium carbonate and the like).

A substrate can be planarized or polished by contacting the surface of the substrate with the polishing system using any suitable technique. For example, in one typical CMP process, a wafer is pressed against a polishing pad using the inventive polishing system under controlled chemical, pressure, velocity, and temperature conditions and the pad and the wafer are moved with respect to each other. Material is then removed from the surface of the wafer.

A substrate can be planarized or polished with the polishing system with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, and coformed products thereof, and mixtures thereof. As discussed above, the abrasive of the polishing system can be fixed (e.g., embedded) in whole or in part, in or on the polishing pad. Such fixation on the polishing pad can be accomplished, for example, by blending the abrasive in to the aforementioned polymers during the formation of the polishing pad or by adhering the abrasive to the pad after the pad is formed using such adherents as are known.

The invention utilizes at least one dispenser, which simultaneously or sequentially dispenses one or more components from the flow lines onto the polishing surface (e.g., the substrate surface or the polishing pad). A single dispenser can be used, from which a single component or any combination of components of the polishing system can be dispensed. Alternatively, the invention can utilize more than one dispenser from which the components of the polishing system are independently dispensed (e.g., one dispenser for each component). Generally, however, the invention utilizes more than one dispenser from each of which different combinations or ratios of components can be dispensed. For example, two or more dispensers can be utilized, each delivering different components simultaneously or sequentially to the same polishing surface.

As can be appreciated, the parameters of the polishing system are not necessarily independent. Preferred polishing systems of the invention are those that, when prepared at the point-of-use, can remove material from a patterned oxide feature with a pattern density of 70% and a pitch of 100 $\mu$m at a rate that is about 115% or more, more preferably at a rate of about 140% or more, and still more preferably at a rate of about 170% or more, of the rate that material is removed using the same polishing system prepared 24 hours prior to use. This test can be performed according to the conditions set out in the Examples herein. Thus, the pH and/or component concentrations, including the alkali metal ion and/or abrasive concentration, of a polishing system can be adjusted in order to provide a desired polishing system of the invention.

Following planarization or polishing of a composite substrate, the used polishing system can be combined with any compound(s) suitable for enhancing the disposability of the polishing system. Suitable compounds include, for example, acids which will decrease the pH of the used polishing system, calcium-containing salts which will act as complexing agents to fluoride ions, and other compounds known to ordinary artisans. These compounds can be added to the polishing system of the invention in any suitable manner. It is suitable, for example, for the compound to be added to the waste stream by which the polishing system exits the polishing surface.

EXAMPLES

The following examples further illustrate the present invention but, of course, should not be construed as in any way limiting its scope.

The polishing systems used in each of the following examples were formulated as two component systems, wherein each component was present in a 1:1 ratio (by volume). The first component (hereinafter the "abrasive component" was the same for each polishing system and was an aqueous dispersion of about 20 wt. % fumed silica having a mean aggregate particle size of 150–180 nm and a surface area of 90 m$^2$/g at basic pH. The second component (hereinafter the "chemical component") was an aqueous chemical solution, which varied according to each example.

Each polishing system described in the following examples was used to polish semiconductor substrates by supplying the two-component polishing system to the polishing platen using each of two different methods. According to the first method (hereinafter referred to as "pre-use mixing"), the polishing system was supplied to the polishing platen to polish a semiconductor substrate 24 hours after combining the first and second components of the polishing system. According to the second method (hereinafter referred to as "point-of-use mixing"), the components of the polishing system were separately supplied to the polishing platen, where the components were mixed and the system was immediately used to polish a semiconductor substrate.

The semiconductor substrate used in each example was a commercially available CMP characterization test wafer comprising a silica dielectric layer (designated the SKW7 pattern wafer by SKW Associates, Inc.) with an MIT test structure featuring a range of pattern densities and pitches. The semiconductor wafers were polished on an IPEC 472 polishing machine using a down-force of about 52 kPa (7.5 psi), back-pressure of about 20 kPa (3 psi), platen speed of 37 rpm, and carrier speed of 24 rpm. Test wafer removal rates were determined by directly measuring the thickness of each test wafer, with respect to a patterned oxide feature with a pattern density of 70% and a pitch of 100 □m, before and after polishing using standard methods.

Example 1

This example illustrates the significance of using an alkali metal ion in conjunction with the polishing system of the present invention.

Polishing systems 1A–1H were prepared by combining the abrasive component and a chemical component as indicated in Table 1, and used to polish semiconductor substrates in conjunction with pre-use and point-of-use mixing as previously described. Table 1 provides the resulting alkali metal ion concentration (where applicable) and pH of the polishing systems, and the polishing rates achieved using each polishing system.

TABLE 1

| Polishing System | Chemical Component | Alkali Metal Ion Concentration On Platen [M] | pH | Pattern Wafer Removal Rate (Å/min) | | Increase in Removal Rate Using Point-of-Use Mixing Over Pre-use Mixing |
| --- | --- | --- | --- | --- | --- | --- |
| | | | | Pre-use Mixing | Point-of Use Mixing | |
| 1A | 0.9 wt. % NaOH | 0.1 | 11.1 | 2972 | 5005 | 70% |
| 1B | 1.3 wt. % KOH | 0.1 | 11.1 | 2953 | 5321 | 80% |
| 1C | 1.5 wt. % CsOH | 0.05 | 11.1 | 2953 | 4096 | 40% |
| 1D | 1.4 wt. % NaCl | 0.1 | 9.8 | 2745 | 2794 | Less than 10% |
| 1E | 1.8 wt. % KCl | 0.1 | 9.7 | 2810 | 2859 | Less than 10% |
| 1F | 1.7 wt. % CsCl | 0.05 | 9.9 | 2824 | 2952 | 10% |
| 1G (comparative) | 0.8 wt. % NH$_4$OH | — | 10.8 | 2661 | 2747 | Less than 10% |
| 1H (comparative) | 1.2 wt. % NH$_4$Cl | — | 9.4 | 2644 | 2716 | Less than 10% |

As indicated by the results recited in Table 1, the polishing systems containing an alkali metal salt or hydroxide (i.e., an alkali metal ion source) (polishing systems 1A–1F) provided higher polishing rates than systems comprising an ammonium salt or hydroxide (i.e., without an alkali metal ion source) (comparative polishing systems 1G and 1H). Moreover, the superior removal rates achieved using polishing systems containing an alkali metal ion source were enhanced by as much as 80% using point-of-use mixing as compared to pre-use mixing. The polishing system containing potassium hydroxide produced the highest polishing rates.

These results show that the polishing system of the present invention can be used to polish a substrate with higher removal rates as compared to other systems especially when used in conjunction with point-of-use mixing.

Example 2

This example further illustrates the effect of point-of-use mixing on the polishing rate achievable using the polishing system of the present invention.

Polishing systems 2A–2D were prepared by combining the abrasive component and a chemical component as indicated in Table 2, and used to polish semiconductor substrates in conjunction with the pre-use and point-of-use mixing methods as previously described. Table 2 provides the resulting alkali metal ion concentration and pH of the polishing systems, and the polishing rates achieved using each polishing system.

TABLE 2

| Polishing System | Chemical Component | Alkali Metal Ion Concentration On Platen [M] | pH | Pattern Wafer Removal Rate (Å/min) | | Increase in Removal Rate Using Point-of-Use Mixing Over Pre-use Mixing |
|---|---|---|---|---|---|---|
| | | | | Pre-Use Mixing | Point-of Use Mixing | |
| 2A | 1.3 wt. % KOH | 0.1 | 11.1 | 3374 | 5394 | 60% |
| 2B | 1.8 wt. % KCl | 0.1 | 9.7 | 3262 | 3519 | 10% |
| 2C | 1.6 wt. % $K_2CO_3$ | 0.06 | 10.4 | 3485 | 3683 | 10% |
| 2D | 1.3 wt. % KOH + 1.1 wt. % $CH_2O_2$ | 0.1 | 9.8 | 3278 | 3476 | 10% |

As indicated by the results recited in Table 2, the polishing systems containing an alkali metal ion (e.g., potassium ion) (polishing systems 2A–2D) provided higher polishing rates in each case when the polishing system was prepared by point-of-use mixing as compared to pre-use mixing. Polishing system 2A containing potassium hydroxide provided the highest polishing rate, which rate was increased by 60% using point-of-use mixing as compared to pre-use mixing.

These results show that point-of-use mixing can be used to enhance the polishing rates produced using the polishing system of the present invention.

Exanple 3

This example illustrates the significance of using an alkali metal ion, as compared to other metal ions, in conjunction with the polishing system of the present invention.

Polishing systems 3A–3D were prepared by combining the abrasive component with a chemical component as indicated in Table 3. The resulting alkali metal ion concentration (where applicable) and pH of the combined system also are provided in Table 3. Each polishing system was used to polish a semiconductor wafer in conjunction with pre-use mixing and point-of-use mixing. The polishing rates achieved using each of the polishing systems are set forth in Table 3.

TABLE 3

| Polishing System | Chemical Component | Alkali Metal Ion Concentration On Platen [M] | pH | Pattern Wafer Removal Rate (Å/min) | | Increase in Removal Rate Using Point-of-Use Mixing Over Pre-use Mixing |
|---|---|---|---|---|---|---|
| | | | | Pre-Use Mixing | Point-of Use Mixing | |
| 3A | 1.3 wt. % KOH | 0.1 | 11.0 | 3784 | 5692 | 50% |
| 3B (comparative) | 0.8 wt. % $Mg(OH)_2$ | — | 10.3 | 2787 | 3276 | 20% |
| 3C (comparative) | 1.0 wt. % $Ca(OH)_2$ | — | 10.6 | gel | 2514 | n/a |
| 3D (comparative) | 1.6 wt. % $Sr(OH)_2$ | — | 10.8 | gel | gel | n/a |

As indicated by the results recited in Table 3, only polishing systems 3A and 3B could be used in conjunction with pre-use mixing without gelling; polishing system 3D could not be used with either pre-use or point-of-use mixing without gelling. A comparison of the removal rates achieved with polishing systems 3A and 3B reveals that a polishing system comprising an alkali metal ion (polishing system 3A) produced a polishing rate that was about 36% higher than the rate produced by a similar polishing system containing non-alkali metal ion (polishing system 3B) when used in conjunction with pre-use mixing, and about 74% higher when used in conjunction with point-of-use mixing. A comparison of the removal rates achieved with polishing systems 3A and 3C (both used in conjunction with point-of-use mixing), reveals an even greater increase (about 126%) in the polishing rate provided by a polishing system containing an alkali metal ion (polishing system 3A) over the rate provided by a similar polishing system containing a non-alkali metal ion (polishing system 3C).

These results show that the polishing system of the present invention (e.g., polishing system comprising an alkali metal ion) provides considerably higher polishing rates than polishing systems containing other types of metal ions, especially when used in conjunction with point-of-use mixing.

Example 4

This example illustrates the effect that the amount of alkali metal hydroxide and/or alkali metal salt has on the polishing rate produced using the polishing system of the present invention.

Polishing systems 4A–4G were prepared by combining the abrasive component and a chemical component as indicated in Table 4, and used to polish semiconductor substrates in conjunction with the pre-use and point-of-use mixing methods as previously described. Table 4 provides the resulting alkali metal ion concentration (where applicable) and pH of the polishing systems, and the polishing rates achieved using each polishing system.

TABLE 4

| Polishing System | Chemical Component | Alkali Metal Ion Concentration On Platen [M] | pH | Pattern Wafer Removal Rate (Å/min) Pre-Use Mixing | Pattern Wafer Removal Rate (Å/min) Point-of-Use Mixing | Increase in Removal Rate Using Point-of-Use Mixing Over Pre-use Mixing |
|---|---|---|---|---|---|---|
| 4A | 0.9 wt. % KCl | 0.06 | 10.0 | 3347 | 3279 | Less than 10% |
| 4B | 1.7 wt. % KCl | 0.1 | 9.9 | 3097 | 3334 | 10% |
| 4C | 1.3 wt. % KCl + 0.3 wt. % KOH | 0.1 | 10.9 | 3762 | 3894 | Less than 10% |

TABLE 4-continued

| Polishing System | Chemical Component | Alkali Metal Ion Concentration On Platen [M] | pH | Pattern Wafer Removal Rate (Å/min) Pre-Use Mixing | Pattern Wafer Removal Rate (Å/min) Point-of-Use Mixing | Increase in Removal Rate Using Point-of-Use Mixing Over Pre-use Mixing |
|---|---|---|---|---|---|---|
| 4D | 0.9 wt. % KCl + 0.7 wt.% KOH | 0.1 | 11.1 | 3759 | 4670 | 20% |
| 4E | 0.4 wt. % KCl + 1.0 wt. % KOH | 0.1 | 11.1 | 3689 | 5199 | 40% |
| 4F | 1.3 wt. % KOH | 0.1 | 11.2 | 3590 | 5887 | 60% |
| 4G | 0.7 wt. % KOH | 0.06 | 11.1 | 3422 | 4235 | 20% |

As indicated by the results recited in Table 4, the polishing rates achieved using polishing systems containing only an alkali metal hydroxide (polishing system 4F–4G) were greater than those produced using polishing systems containing only an alkali metal salt (e.g., alkali metal chloride) (polishing system 4A–4B). Moreover, by comparison of the polishing rates achieved using polishing systems 4C–4F, it is apparent that the polishing rate increases as the ratio of potassium hydroxide:potassium chloride in the polishing system increases. The results also indicate that the rate-enhancing effect of point-of-use mixing increases with the amount of alkali metal hydroxide provided in the polishing system.

These results show that the amounts of alkali metal hydroxide and/or alkali metal salt used in conjunction with the polishing system of the present invention can be adjusted to a her the polishing rate as desired.

Example 5

This example illustrates the kinetics of the effect of the concentration of alkali metal on the polishing rate achieved using the polishing system of the present invention.

Polishing systems 5A–5B were prepared by combining the abrasive component and a chemical component as indicated in Table 5, and used to polish semiconductor substrates with mixing at 0, 10, 30, and 60 minutes, as well as 24 hours, before use, using the mixing methods as previously described. Table 5 provides the resulting alkali metal ion concentration (where applicable) and pH of the systems, the polishing rate achieved by each polishing system, and the percent increase in the polishing rate over the polishing rate achieved by the same polishing system prepared 24 hours before use.

TABLE 5

| Polishing System | Chemical Component | Alkali Metal Ion Concentration On Platen [M] | pH | Pattern Wafer Removal Rate (Å/min) | | | | |
|---|---|---|---|---|---|---|---|---|
| | | | | 0 min | 10 min | 30 min | 60 min | 24 hr |
| 5A | 1.3 wt. % KOH | 0.1 | 11.1 | 6400 | 6300 | 5900 | 5200 | 4100 |
| 5B | 1.5 wt. % CsOH | 0.05 | 11.1 | 5300 | 4800 | 4700 | 4400 | 4100 |

As indicated by the results recited in Table 5, increased polishing rates were observed in polishing systems 5A and 5B when used in polishing about an hour or less after their preparation as compared to the polishing rates observed when these same polishing systems were used in polishing after 24 hours. Polishing system 5A exhibited polishing rates about 130–160% higher, when used 0–60 minutes after mixing, than the polishing rate exhibited by the same polishing system, when used 24 hours after mixing. Polishing system 5B exhibited polishing rates of about 110–130% higher, when used 0–60 minutes after mixing, than the polishing rate exhibited by the same polishing system, when used 24 hours after mixing.

These results show that rates of polishing by polishing systems that contain alkali metals is highest when the systems are used immediately upon mixing and that the polishing rates decrease with time after the polishing system components are mixed.

Example 6

This example illustrates the effect of the concentration of KOH on the polishing rate achieved using the polishing system of the present invention.

Polishing systems 6A–46D were prepared by combining the abrasive component and a chemical component as indicated in Table 6, and used to polish semiconductor substrates in conjunction with the pre-use and point-of-use mixing methods as previously described. Table 6 provides the resulting potassium ion concentration (where applicable) and pH of the systems, and the polishing rates produced using each polishing system.

TABLE 6

| Polishing System | Chemical Component | Alkali Metal Ion Concentration On Platen [M] | pH | Pattern Wafer Removal Rate (Å/min) Pre-Use Mixing | Pattern Wafer Removal Rate (Å/min) Point-of-Use Mixing | Increase in Removal Rate Using Point-of-Use Mixing Over Pre-use Mixing |
|---|---|---|---|---|---|---|
| 6A | 0.2 wt.% KOH | 0.02 | 10.7 | 3000 | 2710 | −10% |
| 6B | 0.4 wt.% KOH | 0.04 | 10.9 | 3200 | 3400 | 10% |
| 6C | 0.9 wt.% KOH | 0.08 M | 11.1 | 3300 | 4500 | 40% |
| 6D | 1.3 wt.% KOH | 0.1 M | 11.1 | 3300 | 5500 | 60% |

As indicated by the results recited in Table 6, the polishing rates achieved using polishing systems containing 0.04 M potassium hydroxide or more (polishing systems 6B–6D) were greater with point-of-use mixing than with pre-use mixing. In contrast, the polishing rate achieved using a polishing system containing only 0.02 M potassium hydroxide (polishing system 6A) was not greater (and, indeed, was less) with point-of-use mixing than with pre-use mixing. Moreover, by comparison of the polishing rates produced using polishing systems 6A–6D, it is apparent that the polishing rate and, thus, the rate enhancement achieved by the polishing system increase as the concentration of potassium hydroxide in the polishing system increases.

These results show that the amounts of alkali metal hydroxide used in conjunction with the polishing system of the present invention can be adjusted to alter the polishing rate as desired.

All of the references cited herein, including patents, patent applications, and publications, are hereby incorporated in their entireties by reference.

While this invention has been described with an emphasis upon preferred embodiments, it will be obvious to those of ordinary skill in the art that variations of the preferred embodiments may be used and that it is intended that the invention may be practiced otherwise than as specifically described herein. Accordingly, this invention includes all modifications encompassed within the spirit and scope of the invention as defamed by the following claims.

What is claimed is:

1. A method of polishing a substrate comprising contacting a surface of a substrate with a polishing system comprising:
   (a) a liquid carrier;
   (b) an alkali metal ion at a concentration of about 0.05 M or more;
   (c) hydroxide ions sufficient to provide the polishing system with a pH of about 9 or more; and
   (d) a polishing pad and/or an abrasive; and polishing at least a portion of the substrate therewith in about 6 hours or less after the polishing system is prepared.

2. The polishing method of claim 1, wherein the liquid carrier is a polar solvent.

3. The polishing method of claim 2, wherein the liquid carrier is water.

4. The polishing method of claim 3, wherein the polishing system comprises an abrasive suspended in the liquid carrier.

5. The polishing method of claim 4, wherein the polishing system comprises about 1–20 wt. % of abrasive suspended in the liquid carrier.

6. The polishing method of claim 4, wherein the polishing system comprises about 5–10 wt. % of abrasive suspended in the liquid carrier.

7. The polishing method of claim 4, wherein the polishing system comprises about 4–6 wt. % of abrasive suspended in the liquid carrier.

8. The polishing method of claim 3, wherein the polishing system comprises a polishing pad and an abrasive, and the abrasive is fixed on the polishing pad.

9. The polishing method of claim 3, wherein no abrasive is present in the polishing system, and the polishing pad is a non-abrasive pad.

10. The polishing method of claim 3, wherein the abrasive is a metal oxide.

11. The polishing method of claim 10, wherein the abrasive is silica.

12. The polishing method of claim 11, wherein the abrasive is fumed silica.

13. The polishing method of claim 3, wherein the alkali metal ion has a concentration of about 0.1 M or more.

14. The polishing method of claim 13, wherein the alkali metal ion has a concentration of about 0.2 M or more.

15. The polishing method of claim 14, wherein the alkali metal ion has a concentration of about 0.4 M or more.

16. The polishing method of claim 15, wherein the alkali metal ion has a concentration of about 0.6 M or more.

17. The polishing method of claim 3, wherein the pH of the polishing system is about 10 or more.

18. The polishing method of claim 17, wherein the pH of the polishing system is about 11 or more.

19. The polishing method of claim 18, wherein the pH of the polishing system is about 12 or more.

20. The polishing method of claim 19, wherein the pH of the polishing system is about 13 or more.

21. The polishing method of claim 3, wherein the polishing system removes material from a patterned oxide feature with a pattern density of 70% and a pitch of 100 $\mu$m at a rate of about 115% or more when the polishing system is prepared at its point-of-use as compared to when prepared 24 hours prior to its use, with all other conditions being the same.

22. The polishing method of claim 21, wherein the polishing system removes material from a patterned oxide feature with a pattern density of 70% and a pitch of 100 $\mu$m at a rate of about 140% or more when the polishing system is prepared at its point-of-use as compared to when prepared 24 hours prior to its use, with all other conditions being the same.

23. The polishing method of claim 22, wherein the polishing system removes material from a patterned oxide feature with a pattern density of 70% and a pitch of 100 $\mu$m at a rate of about 160% or more when the polishing system is prepared at its point-of-use as compared to when prepared 24 hours prior to its use, with all other conditions being the same.

24. The polishing method of claim 1, wherein the alkali metal ion is selected from the group consisting of sodium, potassium, cesium, and combinations thereof.

25. The polishing method of claim 24, wherein the alkali metal ion is potassium.

26. The polishing method of claim 24, wherein the alkali metal ion is cesium.

27. The polishing method of claim 1, wherein the surface of the substrate is contacted with the polishing system in about 1 hour or less after the polishing system is prepared.

28. The polishing method of claim 27, wherein the surface of the substrate is contacted with the polishing system in about 30 minutes or less after the polishing system is prepared.

29. The polishing method of claim 28, wherein the surface of the substrate is contacted with the polishing system in about 10 minutes or less after the polishing system is prepared.

30. The polishing method of claim 29, wherein the polishing system is prepared at its point-of-use.

31. The polishing method of claim 1, wherein the substrate comprises Si atoms.

32. The polishing method of claim 1, wherein the substrate comprises Si, $SiO_2$, $Si_3N_4$, SiON, polysilicon, a low dielectric resin, or combinations thereof.

33. The polishing method of claim 1, wherein material is removed from the polished portion of the substrate at a rate of about 115% or more as compared to the rate material is removed from the polished portion of the substrate using the same polishing system under the same conditions except that the polishing system is used to polish the substrate 24 hours after preparation of the polishing system.

34. A polishing system for polishing a substrate comprising:
 (a) a liquid carrier;
 (b) an alkali metal ion at a concentration of about 0.4 M or more;
 (c) hydroxide ions sufficient to provide the polishing system with a pH of about 9 or more; and
 (d) a polishing pad and/or an abrasive.

35. The polishing system of claim 34, wherein the liquid carrier is water.

36. The polishing system of claim 35, wherein the polishing system comprises an abrasive suspended in the liquid carrier.

37. The polishing system of claim 35, wherein the abrasive is silica.

38. The polishing system of claim 37, wherein the abrasive is fumed silica.

39. The polishing system of claim 35, wherein the alkali metal ion has a concentration of about 0.6 M or more.

40. The polishing system of claim 35, wherein the alkali metal ion is selected from the group consisting of sodium, potassium, cesium, and combinations thereof.

41. The polishing system of claim 35, wherein the pH of the polishing system is about 13 or more.

42. The polishing system of claim 35, wherein the polishing system removes material from a patterned oxide feature with a pattern density of 70% and a pitch of 100 μm at a rate of about 115% or more when the polishing system is prepared at its point-of-use as compared to when prepared 24 hours prior to its use, with all other conditions being the same.

43. The polishing system of claim 42, wherein the polishing system removes material from a patterned oxide feature with a pattern density of 70% and a pitch of 100 μm at a rate of about 140% or more when the polishing system is prepared at its point-of-use as compared to when prepared 24 hours prior to its use, with all other conditions being the same.

44. The polishing system of claim 43, wherein the polishing system removes material from a patterned oxide feature with a pattern density of 70% and a pitch of 100 μm at a rate of about 160% or more when the polishing system is prepared at its point-of-use as compared to when prepared 24 hours prior to its use, with all other conditions being the same.

45. A polishing system for polishing a substrate consisting essentially of:
 (a) a liquid carrier;
 (b) an alkali metal ion at a concentration of about 0.4 M or more;
 (c) hydroxide ions sufficient to provide the polishing system with a pH of about 9 or more; and
 (d) a polishing pad and/or an abrasive.

* * * * *